United States Patent
Sohn et al.

(10) Patent No.: US 7,910,824 B2
(45) Date of Patent: Mar. 22, 2011

(54) DYE-SENSITIZED SOLAR CELL USING ION-BOUND OLIGOMER COMPLEX AND METHOD OF MANUFACTURING THE SAME

(75) Inventors: Byung Hee Sohn, Yongin-si (KR); Sang Cheol Park, Seoul (KR); Jung Gyu Nam, Yongin-si (KR); Won Cheol Jung, Seoul (KR); Young Jun Park, Suwon-si (KR); Yong Soo Kang, Seoul (KR); Yong Gun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 471 days.

(21) Appl. No.: 11/840,126

(22) Filed: Aug. 16, 2007

(65) Prior Publication Data

US 2008/0163925 A1  Jul. 10, 2008

(30) Foreign Application Priority Data

Jan. 5, 2007 (KR) .................... 10-2007-0001365

(51) Int. Cl.
*H01L 31/0203* (2006.01)
(52) U.S. Cl. ........ 136/254; 136/263; 526/213; 526/217; 526/209
(58) Field of Classification Search .................. 136/254, 136/263; 526/213, 217, 209
See application file for complete search history.

(56) References Cited

U.S. PATENT DOCUMENTS

2005/0072462 A1 *  4/2005  Kang et al. ................... 136/263

OTHER PUBLICATIONS

Rogness et al., "Supramolecular main-chain liquid crystalline polymers containing photo-tunable azopyridine linkages", Polymer Preprints, 46(1), 783-784(2005).*
Dye-Sensitized TiO2 Solar Cells Usig Polymer Gel Eectrolytes Base on PVdF-HFP; M.G. Kang et al., ECS, 151, E257, 2004.

* cited by examiner

*Primary Examiner* — Ling-Siu Choi
(74) *Attorney, Agent, or Firm* — Cantor Colburn LLP

(57) ABSTRACT

A dye-sensitized solar cell using an ion-bound oligomer complex is provided. The dye-sensitized solar cell comprises an electrolyte, comprising a first oligomer having a $C_{5-30}$ heteroaryl group containing a nitrogen heteroatom as a basic functional group at both ends of the molecule, mixed with a second oligomer having an acidic functional group selected from among carboxylic acid, phosphoric acid, and sulfonic acid, at both ends of the molecule, to thus form a salt, which then leads to an ion-bound oligomer complex that constitutes the electrolyte. The solar cell exhibits excellent mechanical properties, can be manufactured conveniently, and can have a high energy conversion efficiency.

21 Claims, 1 Drawing Sheet

FIGURE
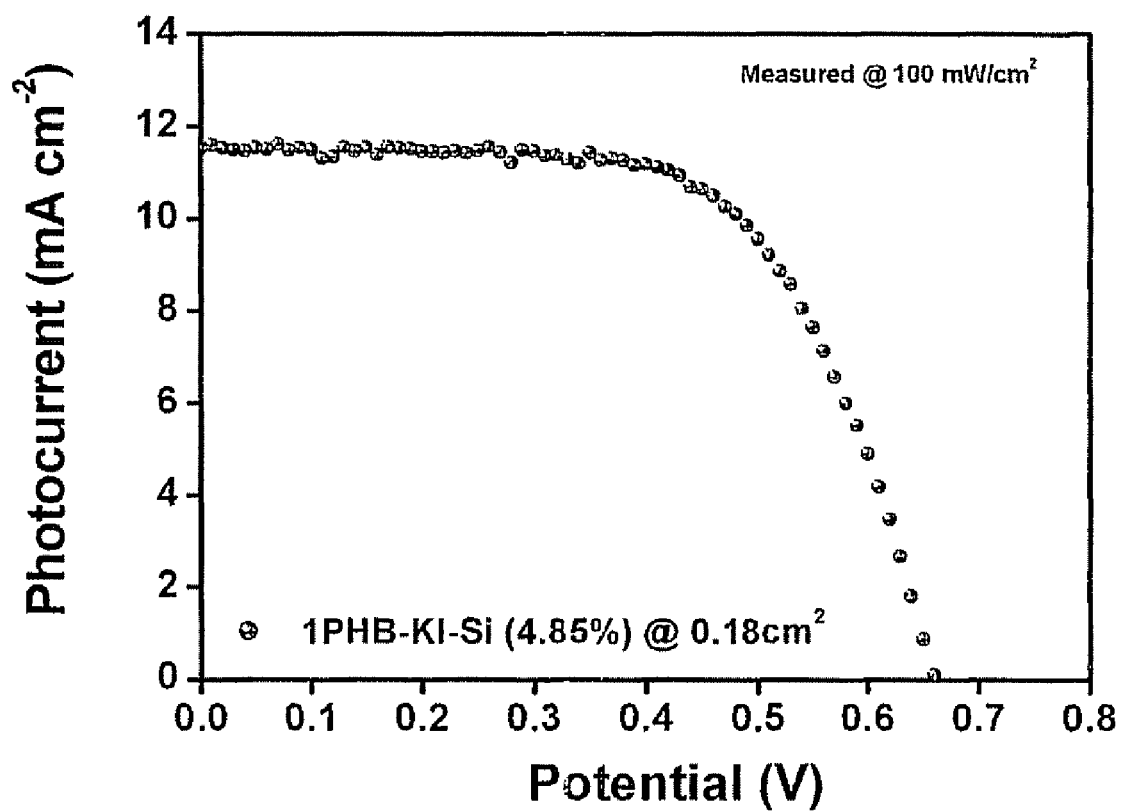

DYE-SENSITIZED SOLAR CELL USING ION-BOUND OLIGOMER COMPLEX AND METHOD OF MANUFACTURING THE SAME

CROSS-REFERENCE TO RELATED APPLICATIONS

This non-provisional application claims priority under U.S.C. §119(a) to Korean Patent Application No. 10-2007-0001365, filed on Jan. 5, 2007, the entire contents of which are hereby incorporated by reference.

BACKGROUND OF THE INVENTION

1. Field of the Invention

The present invention relates, generally, to a dye-sensitized solar cell comprising an ion-bound oligomer complex. More particularly, the present invention relates to a dye-sensitized solar cell comprising an ion-bound oligomer complex electrolyte, which comprises a first oligomer having a $C_{5-30}$ heteroaryl group containing a nitrogen heteroatom as a basic functional group at both ends of the molecule, mixed with a second oligomer having an acidic functional group at both ends of the molecule. The acidic group can be selected from among carboxylic acid, phosphoric acid, and sulfonic acid, at both ends of the molecule, to thus form a salt. The solar cell exhibits the desired mechanical properties, can be manufactured conveniently, and can have a high energy conversion efficiency. Also provided is a method for manufacturing a dye-sensitized solar cell comprising an ion-bound oligomer complex.

2. Description of the Related Art

In general, a solar cell is a photovoltaic device used for the conversion of solar light into electrical energy. A solar cell is usable without limitation, is environmentally friendly, unlike other energy sources, and, is thus expected to become an increasingly important energy source over time. In particular, it is expected that solar cells can be electrically charged solely using solar light and as such, can be mounted to various portable information instruments, such as portable computers, mobile phones, personal portable terminals, and the like.

Conventionally, silicon solar cells made of monocrystal or polycrystal silicon have been mainly utilized. However, the silicon solar cell suffers from disadvantages because it requires the use of large and expensive equipment and subsequently has a high manufacturing cost. Further, the ability to increase the conversion efficiency of solar energy into electrical energy is limited. Therefore, there is a need for novel alternatives.

An alternative to the silicon solar cell, is a solar cell comprised of organic material which can be inexpensively manufactured. In particular, a dye-sensitized solar cell having a very low manufacturing cost is considered. The dye-sensitized solar cell is a photoelectrochemical solar cell comprising a photoelectrode composed of metal oxide nanoparticles having dye particles adsorbed thereon, a counter electrode, and a redox electrolyte loaded in the space between the two electrodes. The photoelectrode consists of a conductive transparent substrate, a metal oxide layer comprising metal oxide, and a dye.

When solar light is incident on the solar cell, photons are first absorbed by the dye. When the dye absorbs solar light it is transformed into an excited state, such that the electrons are transferred to the conduction band of metal oxide and the holes are transferred to the electrolyte layer. The electrons are transferred to the electrode and then flow to the external circuit in order to transmit electrical energy, after which they are transferred to the counter electrode in a lower energy state, at which point the transmitted energy is depleted.

Although a conventional dye-sensitized solar cell using a liquid electrolyte has high energy conversion efficiency, its properties deteriorate over time due to leakage of the electrolyte and evaporation of the solvent. This instability has been related to the detection of salts at low temperatures, and to the use of an organic solvent. Consequently, this type of solar cell is difficult to commercialize. Various attempts have been made to prevent the leakage of the electrolyte. In particular, a dye-sensitized solar cell has been developed using a solid electrolyte that is able to increase the stability and the durability of the solar cell.

Further, in response to the above-mentioned problems with the liquid electrolyte, a gel-type electrolyte has been proposed which enables the electrolyte to penetrate into a polymer. However, this solution is problematic because the viscosity of the gel-type electrolyte is high, and because the gel-type electrolyte is crosslinked by weak interactions between the polymers and thus is easily liquefied when heated.

In this regard, there has been proposed a dye-sensitized solar cell including poly(vinylenefluoride-co-hexafluoropropylene) dissolved in a solvent, such as N-methyl-2-pyrrolidone or 3-methoxypropionitrile, which has a high boiling point. Although the polymer electrolyte thus prepared has high ionic conductivity, similar to the liquid electrolyte at room temperature, it has poor mechanical properties which make it difficult to manufacture the solar cell. In addition, the water-retaining property of the polymer electrolyte is decreased (M. G. Kang et al., ECS., 151, E257, 2004).

In the case of the solar cell using a solid electrolyte, in order to mitigate the problems of low energy conversion efficiency due to the solvent, the solvent is removed from the prepared electrolyte solution. As a result, the electrons received by the photoelectrode are easily reduced using a hole conductive material, which is also in a solid phase to oxidize the dye again resulting in current flow.

Moreover, with the goal of increasing the energy conversion efficiency of the dye-sensitized solar cell using a solid electrolyte, it is also important to develop a polymer electrolyte having high ionic conductivity in order to prevent or inhibit electron recombination. Accordingly, the development of such solar cells is still required.

SUMMARY OF THE INVENTION

In one embodiment, the present invention provides a dye-sensitized solar cell comprising an electrolyte, in which two types of oligomers are mixed together to thus form a salt, which then leads to an ion-bound oligomer complex that constitutes the electrolyte. The dye-sensitized solar cell thereby exhibits excellent mechanical properties, high energy conversion efficiency, and provides for a convenient manufacturing process.

In another embodiment, the present invention provides a method of manufacturing the dye-sensitized solar cell.

In yet another embodiment the invention provides a dye-sensitized solar comprising a photoelectrode, a counter electrode, and an electrolyte layer between the photoelectrode and the counter electrode. The electrolyte layer comprises an electrolyte, comprising an ion-bound oligomer complex produced by mixing a first oligomer having a basic functional group, which is a $C_{5-30}$ heteroaryl group containing a nitrogen heteroatom at both ends of the molecule thereof, with a second oligomer having an acidic functional group, selected from among carboxylic acid, phosphoric acid, and sulfonic acid, at both ends of the molecule thereof; and also including a redox couple.

In accordance with one embodiment, the invention provides a method of manufacturing the dye-sensitized solar cell.

BRIEF DESCRIPTION OF THE DRAWING

The FIGURE is a graph illustrating the relationship between photocurrent and photovoltage for the solar cell manufactured in Example 1 of the present invention.

DESCRIPTION OF THE PREFERRED EMBODIMENTS

Hereinafter, a detailed description of the exemplary embodiments of the present invention will be provided with reference to the accompanying drawing.

According to one embodiment, there is provided a dye-sensitized solar cell, comprising a photoelectrode, a counter electrode, and an electrolyte layer between the photoelectrode and the counter electrode.

According to another embodiment, the electrolyte layer comprises an electrolyte that comprises an ion-bound oligomer complex produced by mixing a first oligomer having a basic functional group, which is a $C_{5-30}$ heteroaryl group containing a nitrogen heteroatom at both ends of the molecule, with a second oligomer having an acidic functional group, selected from among carboxylic acid, phosphoric acid and sulfonic acid, at both ends of the molecule; and, which also includes a redox couple.

According to yet another embodiment, the first oligomer comprising the basic functional group, and the second oligomer comprising the acidic functional group are mixed together to thus prepare the ion-bound oligomer complex that constitutes the electrolyte. When the two types of oligomers are reacted with one another, an organic salt, which may form an ion bond, is produced. It is desirable for the two oligomers to have a low viscosity. Subsequently, through continuous reactions, the oligomers, which are initially liquid, are changed to a solid polymer, resulting in the formation of a solid electrolyte suitable for use in the dye-sensitized solar cell.

The first oligomer having a basic functional group, which is a $C_{5-30}$ heteroaryl group containing a nitrogen heteroatom at both ends of the molecule, may be represented by Formula 1 below:

   [Formula 1]

In Formula 1, $R_1$ is a substituted or unsubstituted $C_{5-30}$ heteroaryl group or a substituted or unsubstituted $C_{5-30}$ heteroarylalkyl group, containing nitrogen as a heteroatom; $R_2$ is a substituted or unsubstituted $C_{1-5}$ alkyl group or, a substituted or unsubstituted $C_{1-5}$ heteroalkyl group; X is selected from among oxygen (O), sulfur (S), selenium (Se), and tellurium (Te); and n is an integer from about 3 to about 14.

As the basic functional group, the $C_{5-30}$ heteroaryl group containing a nitrogen heteroatom refers to an aromatic ring system having about 5 to about 30 ring atoms and including nitrogen as a heteroatom.

Specifically, the oligomer having a $C_{5-30}$ heteroaryl group containing a nitrogen heteroatom as a basic functional group, may be represented by Formulas 2 to 5 below:

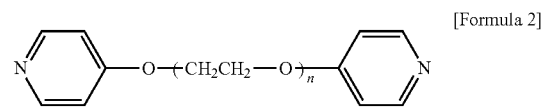   [Formula 2]

   [Formula 3]

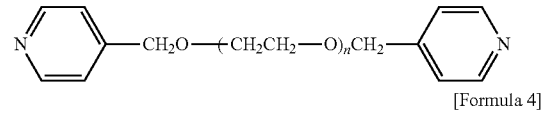   [Formula 4]

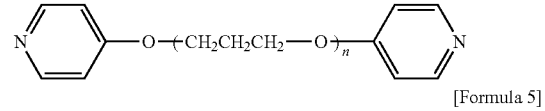   [Formula 5]

In Formulas 2, 3, 4, and 5, n is an integer of about 3 to about 14.

The second oligomer having an acidic functional group at both ends of the molecule, may be represented by Formula 6 below, and more specifically, may be represented by Formulas 7 to 9 below:

$$Y-R_3-X-(R_2X)_n R_3-Y$$   [Formula 6]

In Formula 6, $R_2$ is a substituted or unsubstituted $C_{1-5}$ alkyl group or a substituted or unsubstituted $C_{1-5}$ heteroalkyl group; $R_3$ is selected from among a substituted or unsubstituted $C_{1-10}$ alkyl group, a substituted or unsubstituted $C_{1-10}$ heteroalkyl group, a substituted or unsubstituted $C_{6-30}$ aryl group, a substituted or unsubstituted $C_{6-30}$ arylalkyl group, a substituted or unsubstituted $C_{2-30}$ heteroaryl group, a substituted or unsubstituted $C_{2-30}$ heteroarylalkyl group, a substituted or unsubstituted $C_{5-20}$ cycloalkyl group, a substituted or unsubstituted $C_{2-30}$ heterocycloalkyl group, a substituted or unsubstituted $C_{1-30}$ alkylester group, a substituted or unsubstituted $C_{1-30}$ heteroalkyl ester group, a substituted or unsubstituted $C_{6-30}$ arylester group, and a substituted or unsubstituted $C_{2-30}$ heteroaryl ester group; X is selected from among O, S, Se, and Te; Y is selected from among a carboxylic acid functional group, a phosphoric acid functional group, and a sulfonic acid functional group; and n is an integer of about 1 to about 40;

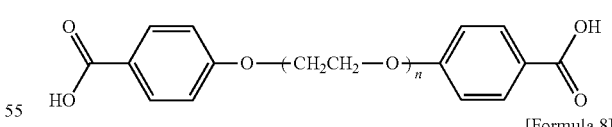   [Formula 7]

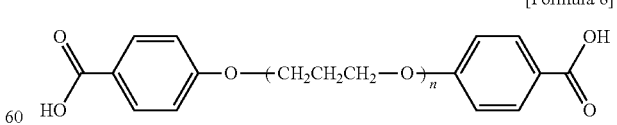   [Formula 8]

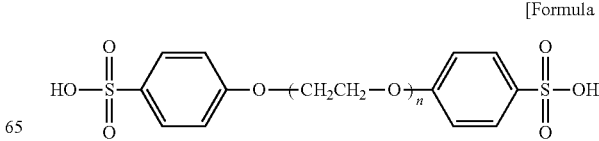   [Formula 9]

In Formulas 7, 8, and 9, n is an integer of about 1 to about 40.

In formulas 7, 8 and 9, specific examples of the alkyl group include, one or more selected from the group consisting of linear or branched alkyl groups, such as methyl, ethyl, propyl, isobutyl, sec-butyl, tert-butyl, pentyl, iso-amyl, hexyl, and the like, wherein one or more hydrogen atoms included in the alkyl group may be substituted with a $C_{1-10}$ alkyl group, a halogen atom, a hydroxyl group, a nitro group, an amino group, a cyano group, an alkoxy group, an amidino group, a hydrazine group, or a carboxyl group.

The heteroalkyl group refers to a radical formed as a result of replacing one or more carbon atoms, preferably about 1 to about 5 carbon atoms, of the main chain of the alkyl group with a hetero atom, such as O, S, N, or P.

The aryl group refers to an aromatic carbocyclic system having one or more aromatic rings, the rings being attached or fused together through a pendent process. Specific examples of the aryl group include one or more selected from the group consisting of aromatic groups, such as phenyl, naphthyl, tetrahydronaphthyl, and the like. Further, one or more hydrogen atoms of the aryl group may be substituted with the same substituent as in the alkyl group.

The arylalkyl group refers to a radical formed as a result of replacing some of the hydrogen atoms of the aryl group defined above with a lower alkyl radical, for example, methyl, ethyl, propyl, and the like, and is exemplified by benzyl and phenylethyl. Further, one or more hydrogen atoms of the arylalkyl group may be substituted with the same substituent as in the alkyl group.

The heteroaryl group refers to an about 5 to an about 30-membered aromatic ring system having 1, 2 or 3 heteroatoms selected from among N, O, P and S, with the remaining ring atoms being C, wherein the rings are attached or fused together through a pendent process. Further, one or more hydrogen atoms of the heteroaryl group may be substituted with the same substituent as in the alkyl group.

The heteroarylalkyl group refers to a radical formed as a result of replacing some of the hydrogen atoms of the heteroaryl group with a lower alkyl radical. Further, one or more hydrogen atoms of the heteroarylalkyl group may be substituted with the same substituent as in the alkyl group.

The cycloalkyl group refers to a monovalent monocyclic system having about 5 to about 30 carbon atoms. One or more hydrogen atoms of the cycloalkyl group may be substituted with the same substituent as in the alkyl group.

The heterocycloalkyl group refers to an about 5 to an about 30-membered monovalent monocyclic system having 1, 2 or 3 heteroatoms selected from among N, O, P and S, with the remaining ring atoms being C. Further, one or more hydrogen atoms of the heterocycloalkyl group may be substituted with the same substituent as in the alkyl group.

The alkylester group refers to a functional group in which the alkyl group is combined with the ester group.

The heteroalkyl ester group refers to a functional group in which the heteroalkyl group is combined with the ester group.

The arylester group refers to a functional group in which the aryl group is combined with the ester group.

The heteroaryl ester group refers to a functional group in which the heteroaryl group is combined with the ester group.

In one embodiment, the electrolyte may be prepared by mixing the first oligomer having the basic functional group, with the second oligomer having the acidic functional group. The prepared oligomer solution is further combined with a redox couple, thus preparing the electrolyte. As such, the first oligomer having the basic functional group, and the second oligomer having the acidic functional group, are preferably mixed at a molar ratio of the acidic functional group to the basic functional group ranging from about 1:1 to about 1:20. More preferably, the oligomers are mixed at a molar ratio of about 1:1.

Further, the first oligomer having the basic functional group, and the second oligomer having the acidic functional group, preferably have a radius of gyration ("R") of about 6 to about 50 Å. The Rg, indicating the coil size of the oligomer electrolyte, is represented by Equation 1 below. In Equation 1, A is the experimental constant of each material, and has an inherent value depending on the type of molecule.

$$Rg(Å)=A\sqrt{Mw} \qquad \text{[Equation 1]}$$

In Equation 1, Mw is the weight average molecular weight of an oligomer.

In another embodiment, specific examples of oligomers having Rg of about 6 to about 50 Å include, one or more selected from the group consisting of polypropylene glycol, polyethylene glycol, polyethylene glycol dimethylether, and a combination comprising at least one or more of the foregoing oligomers. When the Rg of the oligomer falls within the range of about 6 to about 50 Å, the electrolyte may be injected, alike the process used for manufacturing a solar cell comprising a liquid electrolyte, thereby making the manufacturing process more convenient.

In another embodiment, the redox couple is a functional material used to induce a redox reaction in the electrolyte. The redox couple is composed of a halogen anion, such as an iodine ion or a bromine ion, and a counter metal cation. Specific examples of a counter metal cation include one or more selected from the group consisting of metal salts, such as lithium iodide, sodium iodide, potassium iodide, lithium bromide, sodium bromide or potassium bromide, imidazolium iodides, and a combination comprising at least one or more of the foregoing metal cations.

Specific examples of the redox couples include, one or more selected from the group consisting of DMPII (1,1-dimethyl-3-propyl imidazolium iodide), HMII (1-methyl-3-hexyl imidazolium iodide), EMII (1-ethyl-3-methyl imidazolium iodide), MBII (1-methyl-3-butyl imidazolium iodide), LiI (lithium iodide), KI (potassium iodide), and a combination comprising at least one or more of the foregoing redox couples. The redox couple functions by inducing the redox reaction using electrons transferred from the counter electrode. The electrons are subsequently transferred to the organic dye in a ground state, thereby continuously generating current.

In yet another embodiment, a basic functional group, such as a pyridine group, is included in the dye-sensitized solar cell, and is capable of increasing the energy conversion efficiency of the solar cell. The use of low-molecular-weight water having a carboxyl group is one method of preventing or inhibiting electron recombination in the solar cell. In addition, 4-tert-butylpyridine ("4-tBP") reacts with iodine to promote the recombination of the electrons in the electrolyte, thus producing a salt, and thereby decreasing the electron recombination rate and increasing the energy conversion efficiency of the solar cell (H. Kusama et al., *Solar Energy Materials and Solar Cells,* 2003, 80, 167).

In accordance with one embodiment, the electrolyte may further include silica nanoparticles. The silica nanoparticles function to stabilize the electrolyte in order to increase the solidification rate.

In accordance with another embodiment, the dye-sensitized solar cell having such an electrolyte layer comprises a photoelectrode, an electrolyte layer, and a counter electrode.

In one embodiment, the photoelectrode is comprised of a transparent electrode formed by applying a conductive material on a substrate, a metal oxide layer and, a dye adsorbed thereon. In the photoelectrode of the invention, the conductive material is applied on the substrate, thus forming the transparent electrode. Any substrate may be used as long as it is transparent. Specific examples of transparent substrates include, one or more selected from the group consisting of transparent inorganic substrates, such as quartz and glass, and transparent plastic substrates, such as polyethylene terephthalate ("PET"), polyethylene naphthalate ("PEN"), polycarbonate, polystyrene, polypropylene, polymethylmethacrylate, and the like; and a combination comprising at least one of the foregoing transparent substrates. Also, specific examples of the conductive material that is applied on the substrate include, one or more selected from the group consisting of, indium tin oxide (ITO), fluorine-doped tin oxide (FTO), $ZnO$—$Ga_2O_3$, $ZnO$—$Al_2O_3$, $SnO_2$—$Sb_2O_3$ and, a combination of one or more of the foregoing conductive materials.

In another embodiment, the metal oxide layer is composed of metal oxide and a dye adsorbed thereon. Since the metal oxide layer should maximally absorb the solar light energy to insure high power conversion efficiency, the metal oxide surface is increased by using porous metal oxide. Specific examples of the metal oxide include one or more from the group consisting of titanium oxide, tungsten oxide, niobium oxide, hafnium oxide, indium oxide, tin oxide, zinc oxide, and a combination comprising at least one of the foregoing metal oxides. The metal oxide may be used alone or in mixtures of two or more thereof. Preferable examples of the metal oxide include $TiO_2$, $SnO_2$, $ZnO$, $WO_3$, $Nb_2O_5$, $TiSrO_3$, and the like, and a combination comprising at least one of the foregoing metal oxides. Particularly useful is anatase-type $TiO_2$.

In yet another embodiment, any dye may be used as long as it is one typically used in the field of solar cells. Further, the dye is not particularly limited as long as it has a charge separation function and a photosensitizing function. Specific examples of the dye include, one or more from the group consisting of xanthene dyes, such as rhodamine B, rose bengal, eosin or erythrosine, cyanine dyes, such as quinocyanine or cryptocyanine, basic dyes, such as phenosafranine, capri blue, thiosine or methylene blue, porphyrin compounds, such as chlorophyll, zinc porphyrin or magnesium porphyrin, azo dyes, phthalocyanine compounds, complex compounds, such as ruthenium trisbipyridyl, anthraquinone dyes, polycyclic quinone dyes, and a combination of at least one of the foregoing dyes. A ruthenium complex is preferable. The ruthenium complex is exemplified by $RuL_2(SCN)_2$, $RuL_2(H_2O)_2$, $RuL_3$, or $RuL_2$ (where L is 2,2'-bipyridyl-4,4'-dicarboxylate).

According to one embodiment, the counter electrode may be formed from any conductive material, and may also be made of an insulating material having a conductive layer that faces the transparent electrode. As such, the electrode must be formed using electrochemically stable material, in particular, platinum, gold, carbon, or carbon nanotubes. Moreover, to enhance redox catalytic effects, the surface of the counter electrode that faces the transparent electrode preferably has a microstructure that provides an increased surface area. For example, it is preferred that if platinum is used that it be in a state of platinum black and if carbon is used that it be in a state of porous carbon.

According to another embodiment, the solar cell operates as follows. The dye adsorbed on the surface of the metal oxide layer, absorbs light that passes through the transparent electrode and is then incident on the metal oxide layer. When the dye absorbs light, electrons are changed from a ground state to an excited state, thus forming electron-hole pairs. The excited electrons are transferred into the conduction band of metal oxide and are then subsequently transferred to the electrode, thus generating an electromotive force. When the electrons, excited by light from the dye, are transferred to the conduction band of metal oxide, the positively charged dye receives electrons from the hole transfer material of the electrolyte layer, and thus is restored to its original ground state.

According to yet another embodiment, a method of manufacturing the solar cell including the electrolyte is provided. The method of manufacturing the dye-sensitized solar cell, comprising a photoelectrode, a counter electrode, and an electrolyte layer between the photoelectrode and the counter electrode, comprises the steps of: mixing a first oligomer having a basic functional group which is a $C_{5-30}$ heteroaryl group containing a nitrogen heteroatom, at both ends of the molecule, with a second oligomer having an acidic functional group, which is selected from among carboxylic acid, phosphoric acid, and sulfonic acid, at both ends of the molecule, at a molar ratio of the acidic functional group to the basic functional group of about 1:1 to about 1:20, to thus prepare a homogeneous solution; adding the prepared solution with a redox couple, to thus prepare an electrolyte; and injecting the prepared electrolyte between the photoelectrode and the counter electrode.

In accordance with one aspect of the method, the two types of oligomers are mixed at a molar ratio of the acidic functional group to the basic functional group of about 1:1 to about 1:20, and preferably at a molar ratio of about 1:1.

In accordance with another aspect, a method is provided for injecting a mixed solution of two types of oligomers having low viscosity between the photoelectrode and the counter electrode, which have already been formed. As a result, the injection process can be conducted in the same manner used in the manufacture of dye-sensitized solar cells using a liquid electrolyte, thus resulting in a convenient manufacturing process. The method provided herein is unlike the method used for a conventional dye-sensitized solar cell which includes a gel-type or solid electrolyte, and which are prepared through processes of applying an electrolyte on a transparent substrate, drying it, and laminating a substrate having a counter electrode on the applied electrolyte. Ultimately, the present invention is expected to contribute to the commercialization of the solid electrolyte.

The method of manufacturing the dye-sensitized solar cell having the above structure is not particularly limited, and any method may be used as long as it is typically known in the art. For example, a dye-sensitized solar cell may be manufactured by disposing a semiconductor electrode and a counter electrode such that they face each other, simultaneously forming a space for encapsulating the electrolyte layer using a predetermined encapsulating member, and then injecting an electrolyte into such a space. As such, the transparent electrode may be adhered to the counter electrode using an adhesive that includes one or more selected from the group consisting of a thermoplastic polymer film (e.g.: SURLYN®, available from DuPont), epoxy resin, a UV curing agent and, a combination of at least one or more of the foregoing adhesives. After the thermoplastic polymer film is positioned between the two electrodes, they are attached through heating and compression.

In one embodiment, the cell is formed by injecting the two types of oligomers between the photoelectrode and the counter electrode, after which the two types of oligomers are polymerized through continuous reactions of ion bonding over time, leading to a solid electrolyte.

That is, according to the above manufacturing method, the process of injecting a gel electrolyte having a high viscosity may be improved. The two types of oligomers, having low viscosity, are injected, and solidify through ion bonding over time. Hence, upon the formation of the cell, the use of oligomers having low viscosity enables easier injection of the electrolyte resulting in a more convenient manufacturing process.

Herein, exemplary embodiments of the present invention will be described in more detail with reference to the following examples. However, these examples are merely set forth to illustrate the invention, and thus are not to be construed as limiting the scope of the present invention.

EXAMPLES

Preparative Example 1

Synthesis of Polyethyleneglycol-Dipyridine

As outlined in the procedure of Reaction 1 below, polyethyleneglycol-dipyridine ("PEG-dipyridine"), was synthesized such that a pyridine group as a basic functional group, was added at both ends of the molecule.

[Reaction 1]

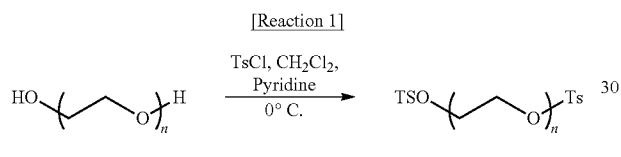

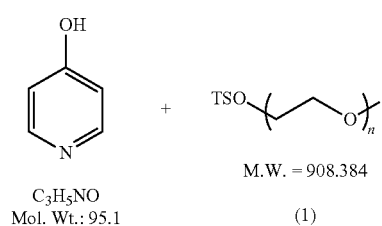

Into a 1 liter {"L"} three-neck flask, PEG, $CH_2Cl_2$, and pyridine were added, and then cooled in an ice bath. Tosyl chloride was then added into the flask in several fractions. The reaction temperature was slowly increased to room temperature, followed by stirring the mixture for two days. Following the completion of the reaction, the reaction product was washed with a 1 N HCl aqueous solution and then washed with distilled water. The organic layer was collected and then dried over $MgSO_4$, thus preparing Compound 1. In cases where a large amount of tosyl chloride was remaining following completion of the reaction, silica gel columns were used to remove the tosyl chloride. When tosyl chloride was completely extracted from the reaction using methylene chloride (M.C.), the product was subsequently eluted with 10% MeOH/M.C.

Compound 1, 4-hydroxypyridine, and DMF (N,N-dimethylformamide) were added into a 1 L three-neck flask, and then stirred while the temperature in the flask was maintained at about 70° C. (in practice, the temperature in the flask was not allowed to exceed 80° C.). After about 24 hours, the reaction was completed, and the DMF was removed under reduced pressure. The reaction product was dissolved in M.C. and was then washed with brine. Thereafter, the organic layer was collected, dried over $MgSO_4$, and then separated using column chromatography. Methylene chloride and methanol were used as developers for the column chromatography. The product yield was 57%. Additional information, regarding the materials used in the synthesis of PEG-dipyridine, including the molecular weight, are shown in Table 1 below.

TABLE 1

|  | 4-Hydroxypyridine | Compound 1 | $K_2CO_3$ | DMF |
|---|---|---|---|---|
| Mw | 95.1 | 908 | 138.21 |  |
| Ratio Equivalent | 2 | 1 | 2.5 |  |
| mMole | 93.92 | 46.64 | 117.4 |  |
| Amount Used | 8.93 g | 42.64 g | 16.23 g | 350 ml |
| Density |  | 0.978 |  |  |

Preparative Example 2

Synthesis of PEG-Diacid

As outlined in Reaction 2 below, PEG-diacid, having a carboxyl group as an acidic functional group at both ends of the molecule, was synthesized.

[Reaction 2]

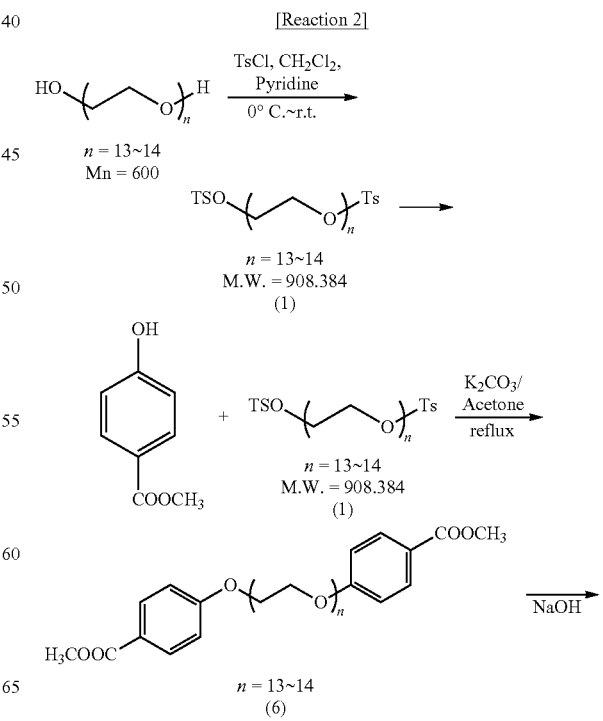

-continued

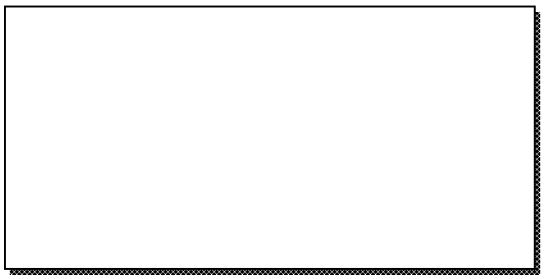

M.W. = 912.32

Material 1 was prepared as described in Preparative Example 1. Into a 1 L, one-neck flask, phenol, acetone, and $K_2CO_3$ were added, followed by the addition of prepared material 1, after which the mixture was refluxed. After reaction for about 14 hours, all of the acetone was removed by rotary evaporator. The reaction product then was dissolved in methylene chloride, and then washed with distilled water. Thereafter, the organic layer was collected, dried over $MgSO_4$, and residual methylene chloride was removed under reduced pressure. Finally, the remaining methyl hydroxybenzoate was removed using column chromatography. Methylene chloride and methanol were used as developers for the column chromatography. The product yield was 85.42%.

rial was applied on a fluorine-doped tin oxide substrate to thus form a transparent electrode. The electrode was then dipped in a solution of a dye of 0.3 mmole (N719, available from Solaronix), prepared in a solvent mixture of methanol and acetonitrile, 1:1 volume ratio, for 24 hours so that the dye was adsorbed thereon. Following adsorption of the dye, a counter electrode composed of platinum material was applied. The electrolyte was injected between the two electrodes, after which the temperature was increased to 100° C. in order to maintain the electrolyte penetration time, and was then decreased to room temperature. The resulting product was a dye-sensitized solar cell.

The PEG-dipyridine and the PEG-diacid were ion-bound to each other according to Reaction 3 below, thus yielding a solid electrolyte.

In order to evaluate the photovoltaic efficiency of the device manufactured in Example 1, photovoltage and photocurrent were measured. As a light source, a Xenon lamp (01193, available from Oriel) was used, and the solar conditions (AM 1.5) of the Xenon lamp were adjusted using a standard solar cell (Furnhofer Institute Solare Energiesysteme, Certificate No. C-ISE369, Type of material: Mono-Si+ KG filter). A graph of the photocurrent-photovoltage curve is shown in the FIGURE. Short-circuit current ($I_{sc}$), open-circuit voltage ($V_{oc}$) and a fill factor (FF), calculated from the above curve, were substituted into the following equation, thus determining the photovoltaic efficiency ($\eta_e$).

$$\eta_e = (V_{oc} \cdot I_{sc} \cdot FF)/(P_{inc}) \qquad \text{[Equation 1]}$$

In Equation 1, $P_{inc}$ is 100 mw/cm² (1 sun).

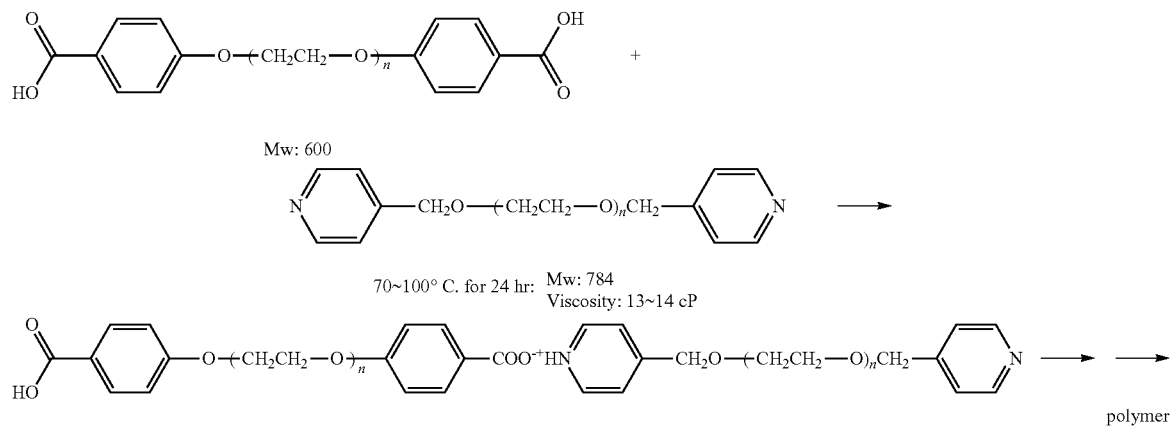

Example 1

Manufacture of a Dye-Sensitized Solar Cell

A homogeneous solution was prepared by dissolving 9.07 g (0.012 mol) of the PEG-dipyridine (Preparative Example 1) and 10 g (0.012 mol) of the PEG-diacid (Preparative Example 2), in 30 ml of acetonitrile, followed by mixing. To the solution, 0.301 g (0.0012 mol) of 1-methyl-3-propyl imidazolium iodide ("MPII") and 0.0304 g (0.00012 mol) of iodine ($I_2$) were added. Silica nanoparticles (11 nm, Aldrich) were also added in an amount of 1.335 g (corresponding to 7 wt % (weight percent) of the total amount of the electrolyte), after which the mixture was stirred for 24 hours, and the solvent was removed. Then, titanium oxide ($TiO_2$) conductive mate- As shown in FIG. 1, the solar cell of Example 1 has an $I_{sc}$ of 11.5 mA cm⁻², a $V_{oc}$ of 0.665 V and a fill factor of 63%, and thus the calculated photovoltaic efficiency of the solar cell is 4.85%. Based on these results, the dye-sensitized solar cell demonstrates excellent energy conversion efficiency.

As described herein, the present invention provides a dye-sensitized solar cell using an ion-bound oligomer complex and a method of manufacturing the same. According to the present invention, a dye-sensitized solar cell comprises an ion-bound oligomer complex electrolyte, comprising a first oligomer having a $C_{5-30}$ heteroaryl group containing a nitrogen heteroatom as a basic functional group at both ends of the molecule, mixed with a second oligomer having an acidic functional group selected from among carboxylic acid, phosphoric acid, and sulfonic acid, at both ends of the molecule, to thus form a salt. The solar cell exhibits excellent mechanical properties, can be manufactured conveniently, and can have a high energy conversion efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A dye-sensitized solar cell comprising:
 a photoelectrode;
 a counter electrode; and
 an electrolyte layer disposed between the photoelectrode and the counter electrode, in which the electrolyte layer comprises an electrolyte comprising an ion-bound oligomer complex produced by mixing a first oligomer having a basic functional group at both ends of the molecule, with a second oligomer having an acidic functional group at both ends of the molecule; and
 a redox couple.

2. The solar cell of claim 1, wherein the basic functional group is a $C_{5-30}$ heteroaryl group containing a nitrogen heteroatom.

3. The solar cell of claim 1, wherein the acidic functional group is selected from the group consisting of carboxylic acid, phosphoric acid, sulfonic acid and, a combination of one or more of the foregoing acidic functional groups.

4. The solar cell as set forth in claim 1, wherein the first oligomer having a basic functional group at both ends of the molecule is represented by Formula 1 below:

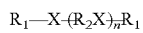 [Formula 1]

wherein $R_1$ is a substituted or unsubstituted $C_{5-30}$ heteroaryl group or a substituted or unsubstituted $C_{5-30}$ heteroarylalkyl group, containing nitrogen as a heteroatom;

$R_2$ is a substituted or unsubstituted $C_{1-5}$ alkyl group or a substituted or unsubstituted $C_{1-5}$ heteroalkyl group;

X is selected from among oxygen, sulfur, selenium, and tellurium; and n is an integer of about 3 to about 14.

5. The solar cell of claim 4, wherein the first oligomer having a basic functional group represented by Formula 1, is selected from the group comprising oligomers represented by Formulas 2, 3, 4 and 5 below:

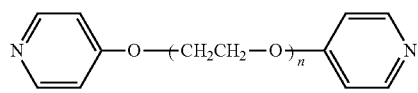 [Formula 2]

wherein n is an integer from about 3 to about 14;

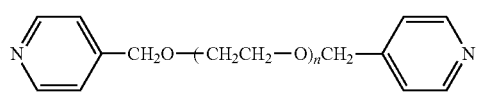 [Formula 3]

wherein n is an integer from about 3 to about 14;

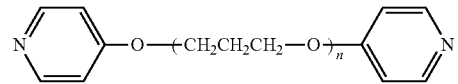 [Formula 4]

wherein n is an integer from about 3 to about 14; and

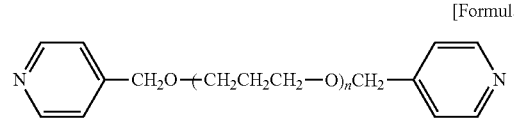 [Formula 5]

wherein n is an integer from about 3 to about 14.

6. The solar cell of claim 1, wherein the second oligomer having an acidic functional group at both ends of the molecule is represented by Formula 6 below:

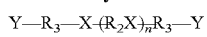 [Formula 6]

wherein $R_2$ is a substituted or unsubstituted $C_{1-5}$ alkyl group or a substituted or unsubstituted $C_{1-5}$ heteroalkyl group;

$R_3$ is selected from among a substituted or unsubstituted $C_{1-10}$ alkyl group, a substituted or unsubstituted $C_{1-10}$ heteroalkyl group, a substituted or unsubstituted $C_{6-30}$ aryl group, a substituted or unsubstituted $C_{6-30}$ arylalkyl group, a substituted or unsubstituted $C_{2-30}$ heteroaryl group, a substituted or unsubstituted $C_{2-30}$ heteroarylalkyl group, a substituted or unsubstituted $C_{5-20}$ cycloalkyl group, a substituted or unsubstituted $C_{2-30}$ heterocycloalkyl group, a substituted or unsubstituted $C_{1-30}$ alkylester group, a substituted or unsubstituted $C_{1-30}$ heteroalkyl ester group, a substituted or unsubstituted $C_{6-30}$ arylester group, and a substituted or unsubstituted $C_{2-30}$ heteroaryl ester group;

X is selected from among oxygen, sulfur, selenium, and tellurium;

Y is selected from among a carboxylic acid functional group, a phosphoric acid functional group, and a sulfonic acid functional group; and n is an integer of about 1 to about 40.

7. The solar cell of claim 6, wherein the second oligomer having an acidic functional group, represented by Formula 6, is selected from the group comprising oligomers represented by Formulas 7, 8 and 9 below:

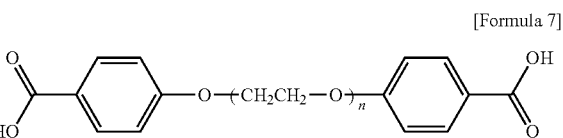 [Formula 7]

wherein n is an integer from about 1 to about 40;

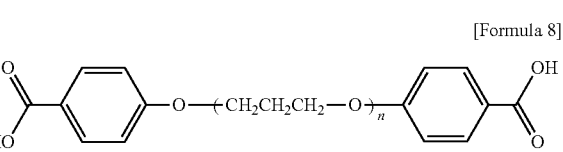 [Formula 8]

wherein n is an integer from about 1 to about 40; and

[Formula 9]

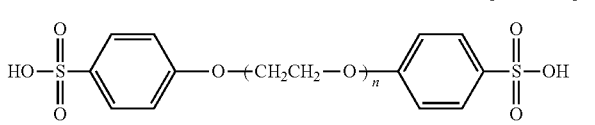

wherein n is an integer from about 1 to about 40.

8. The solar cell of claim 1, wherein the electrolyte layer comprises the second oligomer having an acidic functional group and the first oligomer having a basic functional group mixed at a molar ratio of the acidic functional group to the basic functional group of about 1:1 to about 1:20.

9. The solar cell of claim 8, wherein the molar ratio of the acidic functional group to the basic functional group is about 1:1.

10. The solar cell of 1, wherein the first oligomer having a basic functional group at both ends of the molecule, and the second oligomer having an acidic functional group at both ends of the molecule, have a radius of gyration of about 6 to about 50 Å.

11. The solar cell of claim 1, wherein the redox couple is one or more metal salts selected from the group consisting of lithium iodide, sodium iodide, potassium iodide, lithium bromide, sodium bromide and potassium bromide, imidazolium iodides, and a combination of one or more of the foregoing metal salts.

12. A method of manufacturing a dye-sensitized solar cell comprising:
a photoelectrode,
a counter electrode, and
an electrolyte layer disposed between the photoelectrode and the counter electrode; the method comprising,
preparing a homogeneous solution by mixing a first oligomer having a basic functional group at both ends of the molecule, with a second oligomer having an acidic functional group at both ends of the molecule, at a molar ratio of the acidic functional group to the basic functional group of about 1:1 to about 1:20;
adding the prepared solution with a redox couple, to thus prepare an electrolyte; and
injecting the prepared electrolyte between the photoelectrode and the counter electrode.

13. The method of claim 12, wherein the basic functional group is a $C_{5-30}$ heteroaryl group containing a nitrogen heteroatom.

14. The method of claim 12, wherein the acidic functional group is selected from the group consisting of carboxylic acid, phosphoric acid, sulfonic acid and, a combination of one or more of the foregoing acidic functional groups.

15. The method of claim 12, wherein the first oligomer having a basic functional group at both ends of the molecule, is represented by Formula 1:

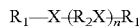   [Formula 1]

wherein $R_1$ is a substituted or unsubstituted $C_{5-30}$ heteroaryl group or a substituted or unsubstituted $C_{5-30}$ heteroarylalkyl group, containing nitrogen as a heteroatom;
$R_2$ is a substituted or unsubstituted $C_{1-5}$ alkyl group or a substituted or unsubstituted $C_{1-5}$ heteroalkyl group;
X is selected from a group consisting of oxygen, sulfur, selenium, and tellurium; and
n is an integer from about 3 to about 14.

16. The method of claim 15, wherein the first oligomer having a basic functional group represented by Formula 1, is selected from the group comprising oligomers represented by Formulas 2, 3, 4 and 5 below:

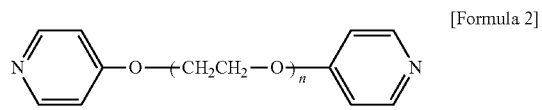

[Formula 2]

wherein n is an integer from about 3 to about 14;

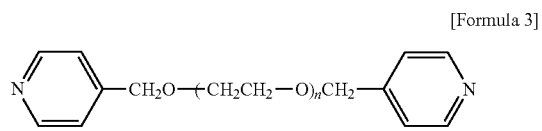

[Formula 3]

wherein n is an integer from about 3 to about 14;

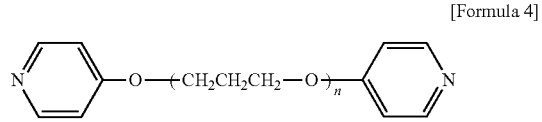

[Formula 4]

wherein n is an integer from about 3 to about 14; and

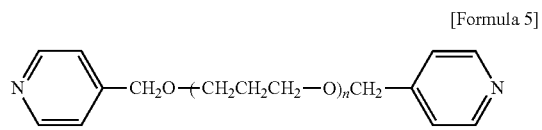

[Formula 5]

wherein n is an integer from about 3 to about 14.

17. The method of claim 12, wherein the second oligomer having an acidic functional group at both ends of the molecule, is represented by Formula 6 below:

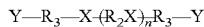   [Formula 6]

wherein $R_2$ is a substituted or unsubstituted $C_{1-5}$ alkyl group or a substituted or unsubstituted $C_{1-5}$ heteroalkyl group; $R_3$ is selected from among a substituted or unsubstituted $C_{1-10}$ alkyl group, a substituted or unsubstituted $C_{1-10}$ heteroalkyl group, a substituted or unsubstituted $C_{6-30}$ aryl group, a substituted or unsubstituted $C_{6-30}$ arylalkyl group, a substituted or unsubstituted $C_{2-30}$ heteroaryl group, a substituted or unsubstituted $C_{2-30}$ heteroarylalkyl group, a substituted or unsubstituted $C_{5-20}$ cycloalkyl group, a substituted or unsubstituted $C_{2-30}$ heterocycloalkyl group, a substituted or unsubstituted $C_{1-30}$ alkylester group, a substituted or unsubstituted $C_{1-30}$ heteroalkyl ester group, a substituted or unsubstituted $C_{6-30}$ arylester group, and a substituted or unsubstituted $C_{2-30}$ heteroaryl ester group; X is selected from among oxygen, sulfur, selenium, and tellurium;
Y is selected from among a carboxylic acid functional group, a phosphoric acid functional group, and a sulfonic acid functional group; and
n is an integer of about 1 to about 40.

18. The method of claim 17, wherein the second oligomer having an acidic functional group represented by Formula 6, is selected from the group comprising oligomers represented by Formulas 7, 8 and 9 below:

[Formula 7]

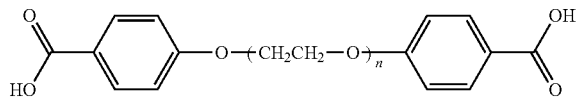

wherein n is an integer from about 1 to about 40;

[Formula 8]

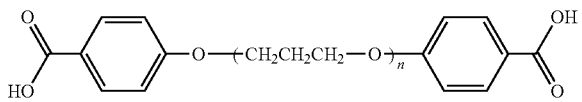

wherein n is an integer from about 1 to about 40; and

[Formula 9]

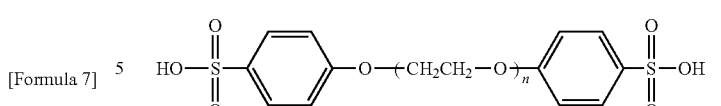

wherein n is an integer from about 1 to about 40.

19. The method of claim 12, wherein the molar ratio of the acidic functional group to the basic functional group is 1:1.

20. The method of claim 12, wherein the first oligomer having a basic functional group at both ends of the molecule, and the second oligomer having an acidic functional group at both ends of the molecule, have a radius of gyration of about 6 to about 50 Å.

21. The method as set forth in claim 12, wherein the redox couple is one or more metal salts selected from the group consisting of lithium iodide, sodium iodide, potassium iodide, lithium bromide, sodium bromide and potassium bromide, imidazolium iodides, and a combination of one or more of the foregoing metal salts.

* * * * *